(12) United States Patent
Scott et al.

(10) Patent No.: US 11,284,527 B2
(45) Date of Patent: Mar. 22, 2022

(54) LATCH ASSEMBLY FOR A MODULAR DEVICE

(71) Applicant: HEWLETT PACKARD ENTERPRISE DEVELOPMENT LP, Houston, TX (US)

(72) Inventors: Micheal D. Scott, Chippewa Falls, WI (US); Alan Doerr, Magnolia, TX (US); Harvey J. Lunsman, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 200 days.

(21) Appl. No.: 16/807,807

(22) Filed: Mar. 3, 2020

(65) Prior Publication Data

US 2021/0282282 A1 Sep. 9, 2021

(51) Int. Cl.
*H05K 5/02* (2006.01)
*H05K 7/14* (2006.01)
*F16B 5/06* (2006.01)

(52) U.S. Cl.
CPC ......... *H05K 5/0221* (2013.01); *F16B 5/0621* (2013.01); *H05K 7/1489* (2013.01)

(58) Field of Classification Search
CPC .................................................. H05K 7/1411
See application file for complete search history.

(56) References Cited

U.S. PATENT DOCUMENTS

| | | | |
|---|---|---|---|
| 3,910,669 A | 10/1975 | MacMaster et al. | |
| 7,477,525 B2 | 1/2009 | Coutancier et al. | |
| 7,677,680 B1 | 3/2010 | Chang | |
| 8,226,433 B1 | 7/2012 | Correll et al. | |
| 9,521,769 B2 | 12/2016 | Howell et al. | |
| 9,894,796 B1* | 2/2018 | Christenson | ......... H05K 7/1411 |
| 10,178,791 B1 | 2/2019 | Kho et al. | |
| 2016/0208525 A1* | 7/2016 | Arlinghaus | ............... E05C 9/04 |

* cited by examiner

*Primary Examiner* — Jerry Wu
(74) *Attorney, Agent, or Firm* — Nolte Lackenbach Siegel (57) ABSTRACT

A latch assembly includes a latch body, a fastener longitudinally inserted through the latch body, a traveling body, a latch pawl, and a spring device. The fastener includes a head and a shank. The shank includes a thread portion and a second portion, with the second portion disposed between the thread portion and the head. The traveling body is threaded onto the thread portion of the shank such that the traveling body longitudinally traverses the thread portion as the fastener is rotated. The latch pawl is pivotally coupled to the traveling body and pivots while engaging and disengaging the latch body. The spring device is disposed on the shank between the head and the latch body. The spring device surrounds the second portion of the shank.

20 Claims, 11 Drawing Sheets

LATCH ASSEMBLY FOR A MODULAR DEVICE

BACKGROUND

Computing systems, such as server assemblies, include electronic devices. For example, an electronic device may include a modular device. The modular device may be inserted into a chassis to form a part of a computing system. One or more latches may be used to secure the modular device within the chassis.

BRIEF DESCRIPTION OF THE DRAWINGS

The present disclosure is best understood from the following detailed description when read with the accompanying drawings. Features of the present disclosure are illustrated by way of example and not limited in the following figures, in which like numerals indicate like elements, in which.

DETAILED DESCRIPTION

Illustrative examples of the subject matter claimed below will now be disclosed. In the interest of clarity, not all features of an actual implementation are described in this specification. It will be appreciated that in the development of any such actual implementation, numerous implementation-specific decisions may be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Latch assemblies may be used to secure an electronic device into a computing system, such as into a chassis of a computing system. Some latch assemblies include screws that apply a force directly to the electronic device to insert the electronic device into the chassis. For such latch assemblies, excessive torque might be applied to the screw, when inserting the electronic device, resulting in forces that may crush or otherwise damage mechanical features of the electronic device and/or the chassis.

According to illustrative examples, a latch assembly may be designed to minimize or eliminate the excessive torque that could damage mechanical features of the electronic device and/or the chassis. In one example, a latch assembly includes the latch body, a fastener longitudinally inserted through the latch body, a traveling body, a latch pawl, and a spring device. The fastener includes a head and a shank. The shank includes a thread portion and a second portion, with the second portion disposed between the thread portion and the head. The traveling body is threaded onto the thread portion of the shank such that the traveling body longitudinally traverses the thread portion as the fastener is rotated. The latch pawl is pivotally coupled to the traveling body and pivots while engaging and disengaging the latch body. The spring device is disposed on the shank between the head and the latch body. The spring device surrounds the second portion of the shank.

Including the traveling body in the latch assembly may provide a hard stop to help prevent excessive torque on the screw. Additionally, including the spring device in the latch assembly allows the force applied while inserting the electronic device to be carefully controlled to avoid damaging the mechanical features of the electronic device and/or the chassis. This is because instead of the force from the screw acting directly on the electronic device, the spring force from the spring device acts on the electronic device to push the electronic device into the chassis. Moreover, the spring force of the spring device can be designed based on the characteristics of springs or spring discs used to construct the spring device.

Including the spring device in the latch assembly also allows movement of the electronic device after mating connectors of the electronic device with connectors of the chassis. Such movement may help relieve fluid pressure buildup from a coolant system, for instance, when the computing system is operational or non-operational. Without the movement allowed by the spring device, mechanical features of the electronic device and/or the chassis might be damaged by the fluid pressure.

Moreover, including the latch pawl in the latch assembly allows for ease of use in engaging and disengaging the electronic device from the chassis. Namely, the latch pawl may be mounted to the traveling block such that it automatically retracts into the latch body when the screw is rotated in a first direction until an end of the latch pawl engages with a surface of the latch body. This may create clearance between the electronic device and the chassis to insert or remove the electronic device from the chassis. Likewise, the latch pawl may be mounted to the traveling block such that it automatically extends from within the latch body when the screw is rotated in a direction opposite the first direction, until the end of the latch pawl disengages with the surface of the latch body. The screw may then continue to be rotated in the direction opposite the first direction until an opposite end of the latch pawl automatically engages with a protrusion of the chassis, to secure the electronic device within the chassis.

Figure 1:
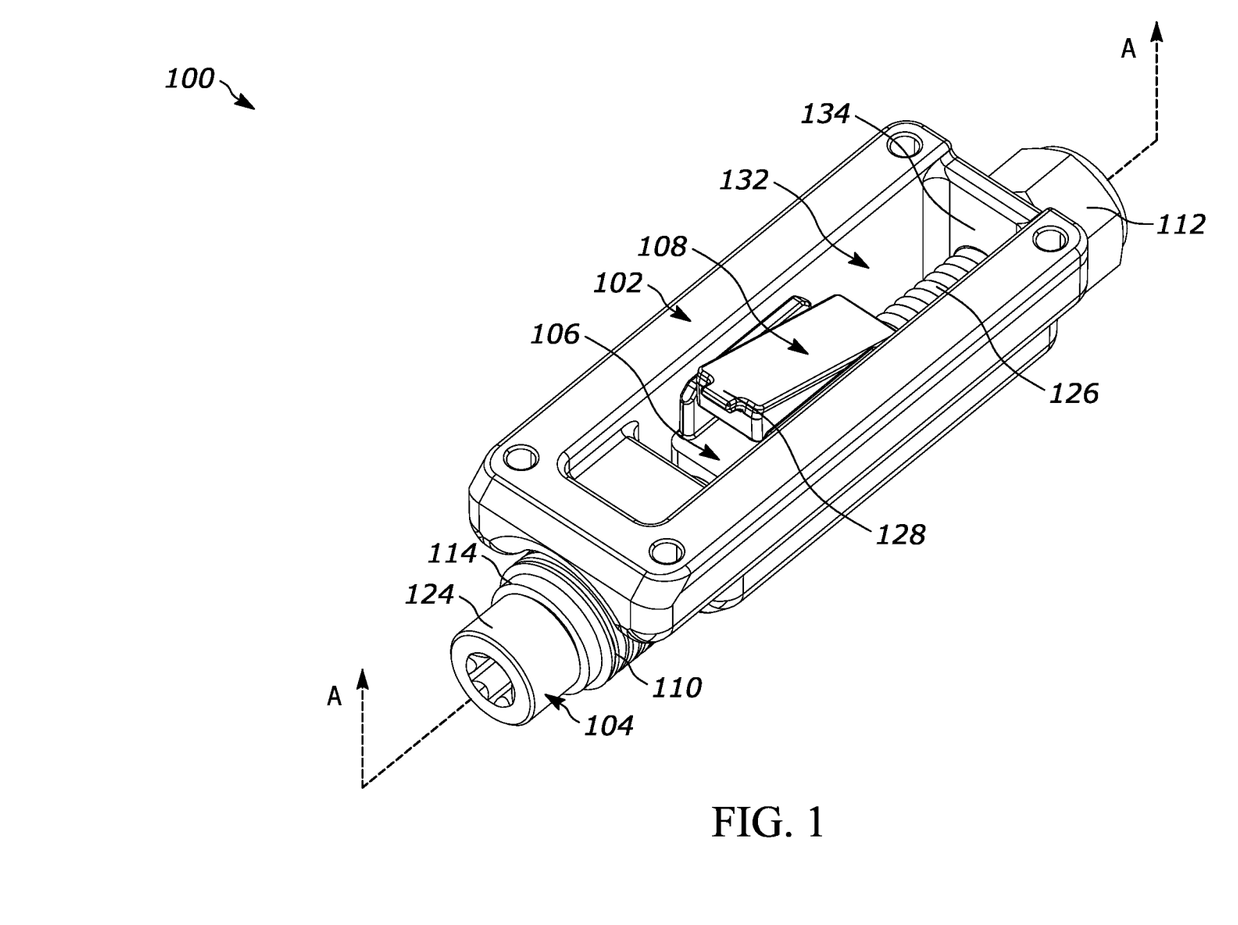
FIG. 1 depicts a latch assembly, according to one or more examples of the present disclosure.
Figure 2:
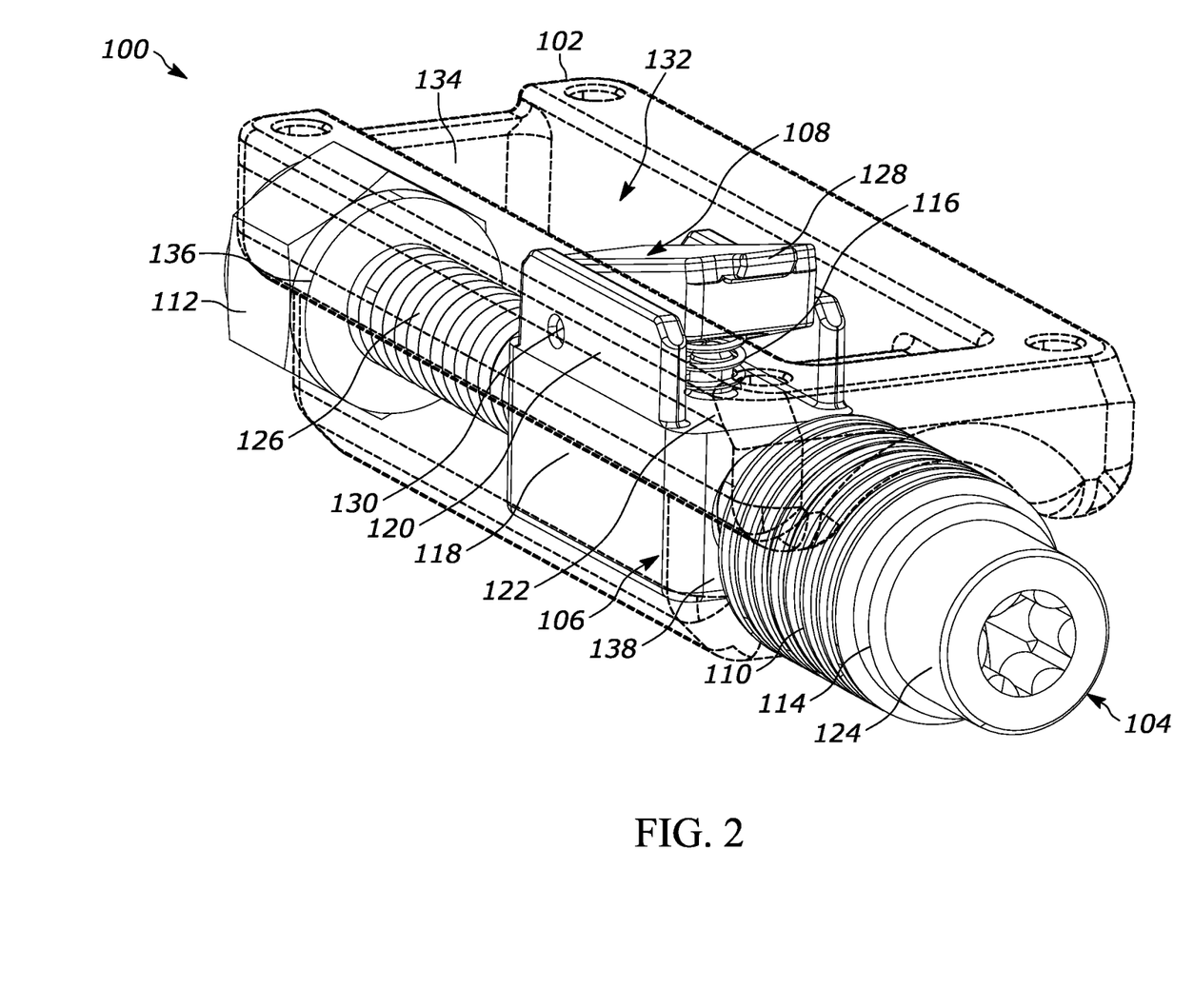
FIG. 2 depicts a view of the latch assembly of FIG. 1 with a transparent latch body, according to one or more examples of the present disclosure.

Turning now to the drawings, FIGS. 1 and 2 depict a latch assembly 100, according to one or more examples of the present disclosure. In FIG. 2, the latch assembly 100 is shown with a transparent latch body to illustrate additional features of the latch assembly 100. The illustrated latch assembly 100 includes a latch body 102, a fastener 104, a traveling body 106, a latch pawl 108, a spring device 110, and a pawl spring 116.

As illustrated in FIGS. 1 and 2, the traveling body 106 is seated within a recess 132 of the latch body 102. Moreover, the traveling body 106 includes a block portion 118 and two sides 120 (only one labeled) extending from a base 122 of the block portion 118. The block portion 118 further contains a threaded hole (not shown) therethrough.

As further illustrated in FIGS. 1 and 2, the fastener 104 is a screw (which may also be referred to as a bolt) having a head 124 and a shank 126 connected to the head 124. At least a portion of the shank 126 includes threads. The shank 126 is longitudinally inserted through the latch body 102. Particularly, the shank 126 is inserted through the threaded hole (not shown) of the block portion 118 of the traveling body 106. As such, the traveling body 106 is threaded onto the shank 126 of the fastener 104.

Consequently, during operation of the latch assembly 100, as the fastener 104 is rotated, for instance using a tool (not shown) inserted into the head 124, the traveling body 106 is linearly translated through the latch body 102. Moreover, as the fastener 104 rotates, the fastener 104 may held in place by a fastener (e.g., nut 112) and a washer 114, of the latch assembly 100. As shown, the washer 114 is disposed between the head 124 of the fastener 104 and the spring device 110. The fastener (in this case the nut) 112 is treaded onto an end of the fastener 104 to secure the fastener 104 into the latch body 102.

The latch pawl 108 is mounted in a manner that allows it to pivot relative to the traveling body 106. As illustrated, the latch pawl 108 has an extension member 128 on an end closest to the head 124 of the fastener 104 and a cam (not shown) on an opposite end from the extension member 128. The latch pawl 108 is mounted to and between the sides 120 of the traveling body 106. In the illustrated example, the mounting is near the cam (not shown) of the latch pawl 108. Any suitable fastening mechanism may be used to mount the latch pawl 108 to the traveling body 106 including, but not limited to, screws, pins, and protrusions from the latch pawl 108 that extend into holes 130 of the sides 120. The pawl spring 116 is coupled between the latch pawl 108 and the base 122 of the block portion 118.

During operation of the latch assembly 100, the latch pawl 108 automatically pivots while engaging and disengaging the latch body 102. More particularly, responsive to the fastener 104 being rotated in a first direction, the traveling body 106 may linearly translate toward a surface 134 within the recess 132 of the traveling body 106. As the cam (not shown) engages the surface 134, thereby causing the latch pawl 108 to pivot toward the recess 132 and compress the pawl spring 116. This pivoting and compression retracts the latch pawl 108 into the recess 132 of the latch body 102.

Conversely, responsive to the fastener 104 being rotated in an opposite direction, the traveling body 106 may linearly translate away from the surface 134 within the recess 132 of the traveling body 106. As the cam (not shown) disengages from the surface 134, a spring force of the pawl spring 116 automatically pivots and extends the latch pawl 108 from within of the recess 132.

Also illustrated in FIGS. 1 and 2, the spring device 110 surrounds a portion of the shank 126 and is disposed between the head 124 and an exterior surface 138 of the latch body 102. The latch assembly 100 may also include a washer 136. The washer 136 is disposed between the nut 112 and an exterior surface of the latch body 102.

Figure 3:
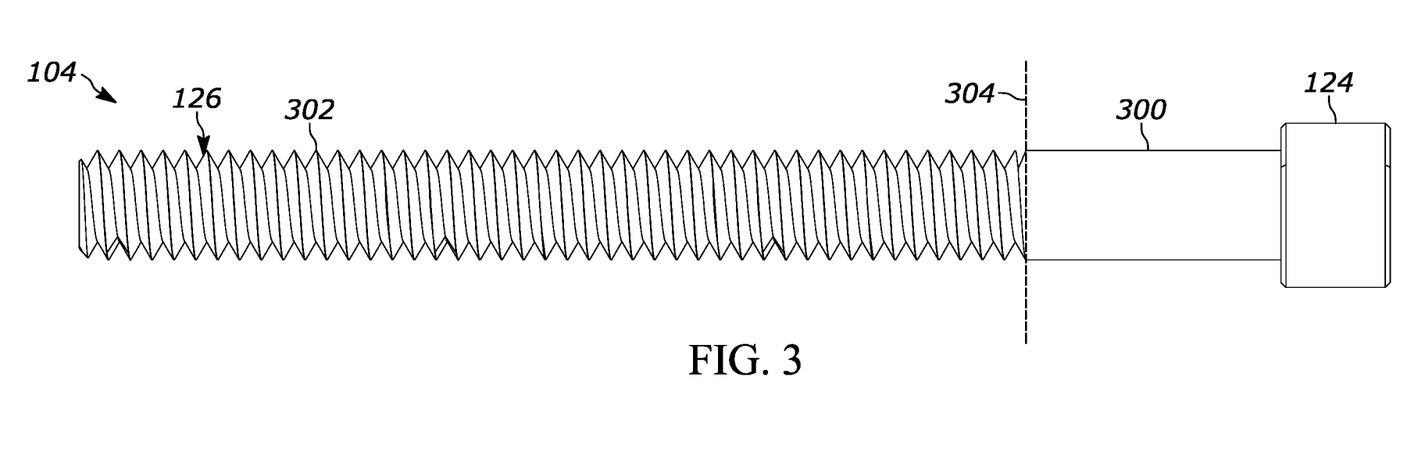
FIG. 3 depicts a plan view of a fastener of the latch assembly of FIG. 1, according to one or more examples of the present disclosure.

FIG. 3 depicts a plan view of the fastener 104 of the latch assembly 100 of FIG. 1, according to one or more examples of the present disclosure. In this example, the fastener 104 is a partially threaded screw, with the shank 126 having a thread portion 302 and a second portion 300 disposed between the head 124 and the thread portion 302. The second portion 300 has no threads. A thread run-out, as indicated by a line labeled 304, demarcates a transition between the second portion 300 (in other words, the unthreaded portion) and the thread portion 302 of the shank 126.

The traveling body 106 (not shown in FIG. 3) may be threaded onto the thread portion 302 within the recess 132 of the latch body 102 (not shown in FIG. 3). Accordingly, a length of the thread portion 302 is greater than a maximum travel distance of the traveling body 106, so that the fastener 104 may be threaded through the nut 112 located external to the latch body 102. The spring device 110 (not shown in FIG. 3) may be positioned to surround the second portion 300 of the shank 126. Accordingly, a length of the second portion 300 is greater than a height of the spring device 110.

In the example fastener 104 shown in FIG. 3, the portions 300 and 302 of the shank 126 have a same or substantially the same diameter. Accordingly, the thread run-out 304 provides a stopping point for the linear traversal of the traveling body 106 (not shown in FIG. 3). In another example not shown, the fastener 104 may be a shoulder screw, wherein the second portion 300 is unthreaded and has a diameter larger than the diameter of the thread portion 302. In another example, both portions 300 and 302 of the shank 126 are threaded and have a same diameter. In this example, a ridge having a larger diameter than both portions 300 and 302 of the shank 126 may provide a stopping point for the linear traversal of the traveling body 106. In yet another example not shown, the second portion 300 may have a diameter larger than a diameter of the threaded hole of the thread portion 302 to provide a stopping point for the linear traversal of the traveling body 106.

In an example, the spring device 110 includes one or more disc springs, for instance a plurality of stacked disc springs. The plurality of disc springs may be a plurality of spring washers or a plurality of wave springs. Multiple disc springs may be stacked to modify the spring constant (e.g., a working load) or an amount of deflection of the spring device 110. In another example, the spring device 110 may include one or more coil springs.

Figure 4A:
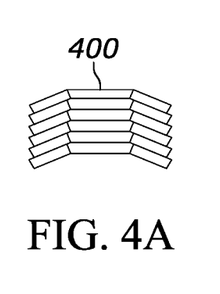
FIGS. 4A-4C depicts multiple spring device configurations for a latch assembly, according to one or more examples of the present disclosure.
Figure 4B:
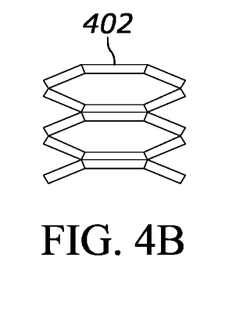
Figure 4C:
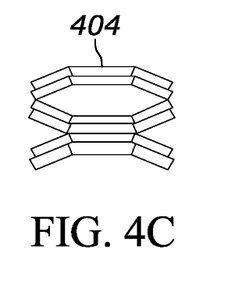

FIGS. 4A-4C depict multiple spring device configurations 400, 402, 404 for a latch assembly, according to one or more examples of the present disclosure. For example, the spring device 110 of the latch assembly 100 of FIGS. 1 and 2 may be implemented using one of these three spring device configurations. Each of the configurations 400, 402, and 404 represents a stack of disc springs, and in a particular example a stack of Belleville washers. Depending on the particular configuration used, one or both the working load or deflection of a spring device may be modified, e.g., increased.

Configuration 400 represents a "nested" stack where the plurality of disc springs is stacked in the same direction. In a nested stack, working load is multiplied by the number of disc springs used, while deflection remains unchanged. Configuration 402 represents an "inverted" stack where the plurality of disc springs is stacked in alternating directions. In an inverted stack, deflection is multiplied by the number of disc springs used, while the working load remains unchanged. Configuration 404 represents a "nested and inverted" stack where some groups of disc springs have a nested stack configuration, and other groups of disc springs have an inverted stack configuration. Configuration 404 allows both the working load and the deflection to be designed.

Figure 5:
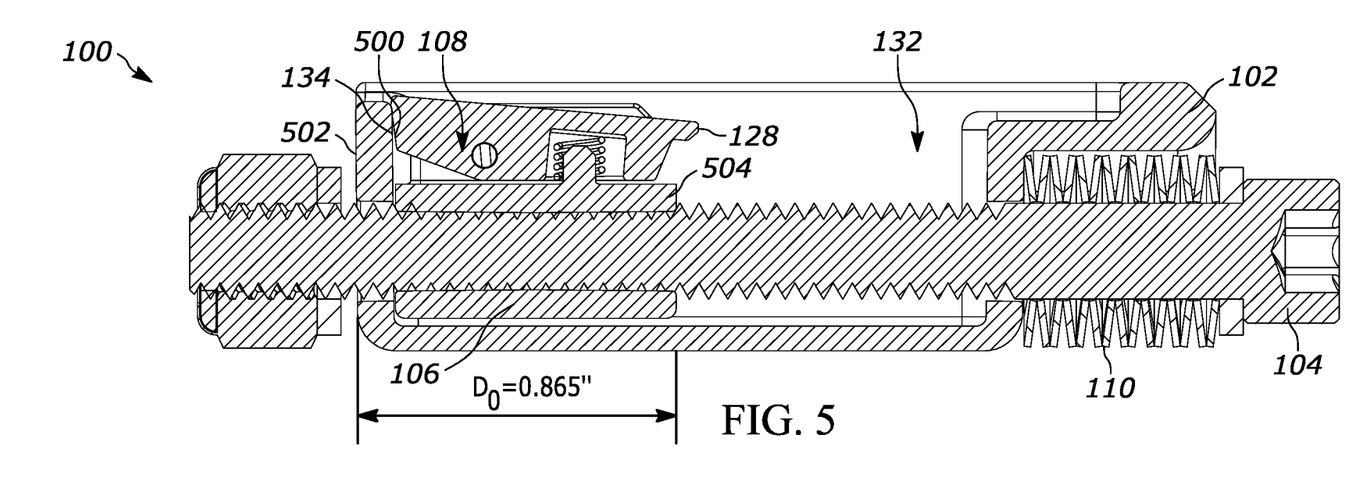
FIG. 5 depicts a cross-sectional view of the latch assembly of FIG. 1 in a first positional state, according to one or more examples of the present disclosure.
Figure 6:
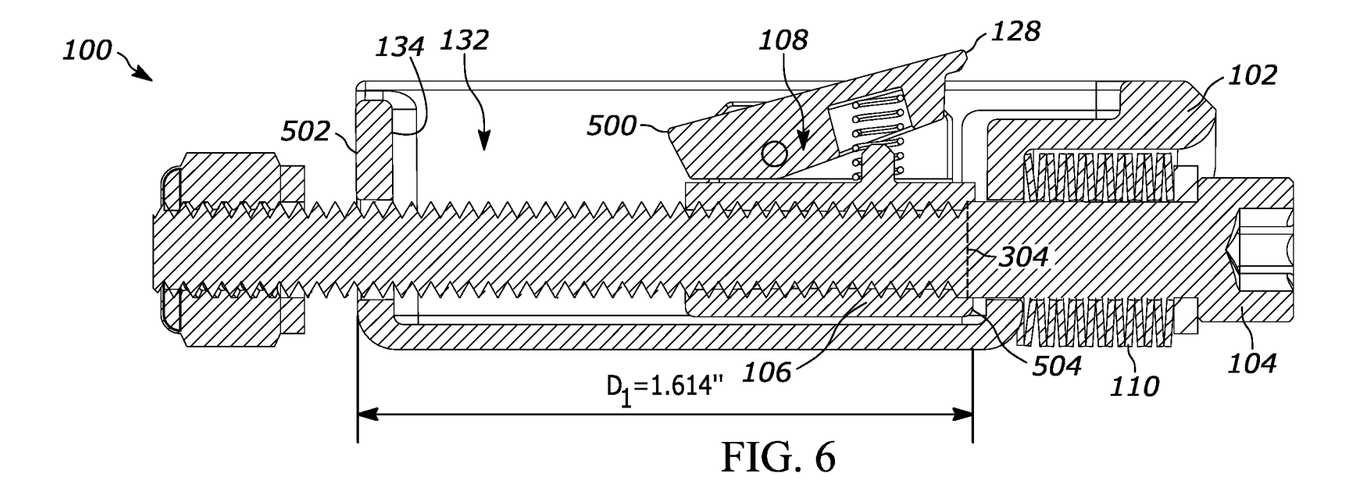
FIG. 6 depicts a cross-sectional view of the latch assembly of FIG. 1 in a second positional state, according to one or more examples of the present disclosure.
Figure 7:
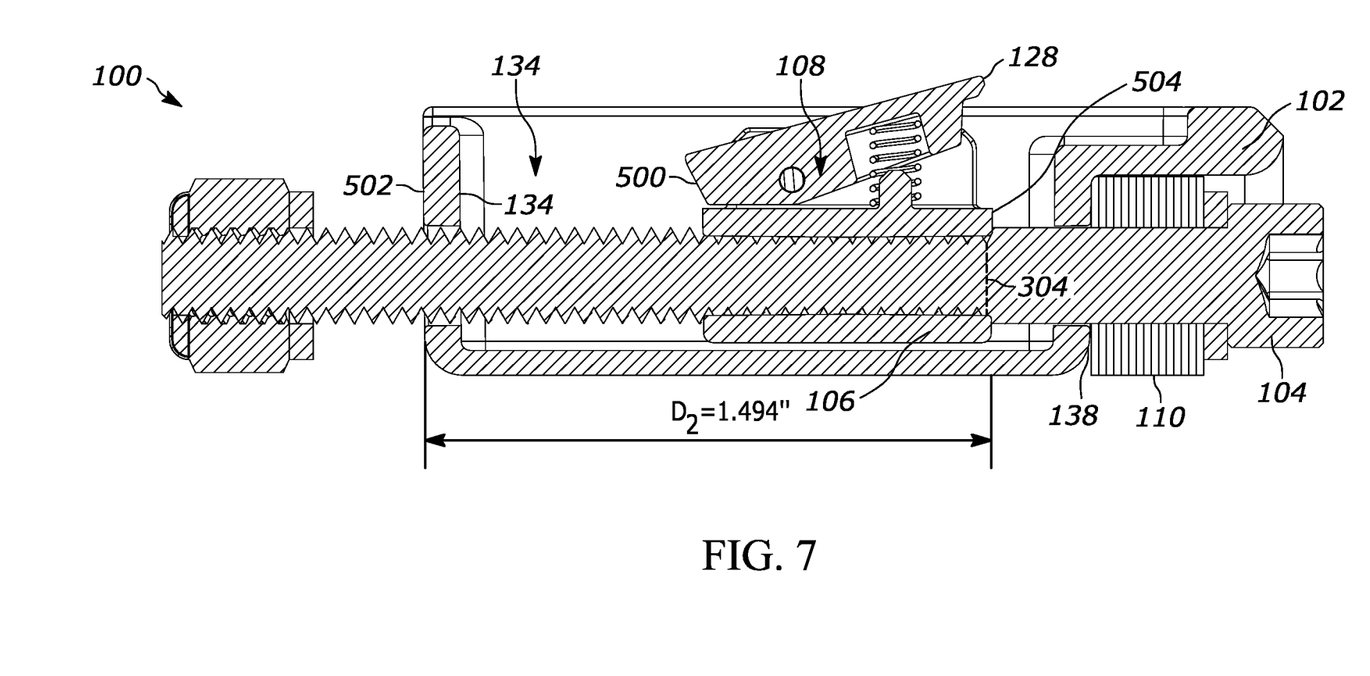
FIG. 7 depicts a cross-sectional view of the latch assembly of FIG. 1 in a third positional state, according to one or more examples of the present disclosure.

FIG. 5-7 depict cross-sectional views through a line AA in FIG. 1 of the latch assembly 100 of FIG. 1 in three different positional states, according to one or more examples of the present disclosure. Each positional state is represented by a distance measured relative to a position and/or state of one or more components within the latch assembly 100. In the examples shown in FIGS. 5-7, distances $D_0$, $D_1$, and $D_2$ are measured relative to different positions of the traveling body 106 within the latch body 102 and relative to different compression states of the spring device 110.

In the examples shown, the distances $D_0$, $D_1$, and $D_2$ are measured between an external edge 502 of the latch body 102 and an edge 504 of the traveling body 106. Do serves as a reference distance, and $D_1$ and $D_2$ may be used to determine the latch assembly 100 working range of $\Delta D$, where $\Delta D = D_1 - D_2$. In accordance with the present teachings, the $\Delta D$ of latch assemblies coupled within an electronic device may be designed or configured so that the electronic device properly mates within a computing system. In a particular example, the $\Delta D$ of the latch assemblies may be designed or configured so that connectors of the electronic device properly blindmate with connectors of a chassis the a computing system.

FIG. 5 illustrates a first positional state of the latch assembly 100, as represented by the distance $D_0$. As illustrated, $D_0$ is 0.865". In this first positional state, the fastener 104 has been rotated in a first direction such that a cam 500 formed on an end of the latch pawl 108 fully engages with the internal surface 134 of the latch body 102. "Fully engaging" means that the latch pawl 108 can pivot no further within the recess 132 of the latch body 102. The latch pawl 108 is, thereby, "fully retracted" within the latch body 102. Additionally, in this first positional state, the spring device 110 is at a state of maximum decompression.

FIG. 6 illustrates a second positional state of the latch assembly 100, as represented by the distance $D_1$. As illustrated, $D_1$ is 1.614". In this second positional state, the fastener 104 has been rotated in a second direction (opposite the first direction) such that the cam 500 formed on the end of the latch pawl 108 has fully disengaged from the internal surface 134 of the latch body 102. "Fully disengaged" means that the latch pawl 108 can pivot no further outside the recess 132 of the latch body 102. The latch pawl 108 is, thereby, "fully extended" from within the latch body 102. Additionally, in this positional state, the extension member 128 of the latch pawl 108 may engage with a portion of a computing system. For example, as will be illustrated and described later, the extension member 128 may engage with a protrusion from a chassis.

Further, in this second positional state, the traveling body 106 has traveled to the thread run-out 304. Also, in this example, the edge 504 of the traveling body 106 is a maximum distance from the external edge 502 of the latch body 102. Thus, $D_1$ may be said to represent the "maximum travel" of the latch assembly 100, meaning the travel of the traveling body 106 from one end of the recess 132 to the other end of the recess 132. Moreover, the spring device 110 is in a compressed state, but is not fully compressed. For example, this partially compressed state corresponds to a maximum height of the spring device 110 to deliver a spring force needed to mate one or more connectors of a modular device to connectors within a chassis of a computing system. In a particular implementation, this partially compressed state of the spring device 110 allows for movement of the modular device within the chassis after mating of the connectors.

FIG. 7 illustrates a third positional state of the latch assembly 100, as represented by the distance $D_2$. As illustrated, $D_2$ is 1.494". In this third positional state, the traveling body 106 has traveled to the thread run-out 304. However, the spring device 110 is in a fully compressed state, and the traveling body 106 is no longer a maximum distance from the external edge 502 of the latch body 102. In an example, the modular device, to which the latch assembly 100 is coupled, has shifted in chassis. The shift of the modular device may linearly translate the latch body 102 toward the head of the fastener 104 and, thereby, further (and in this example fully) compress the spring device 110.

Figure 8:
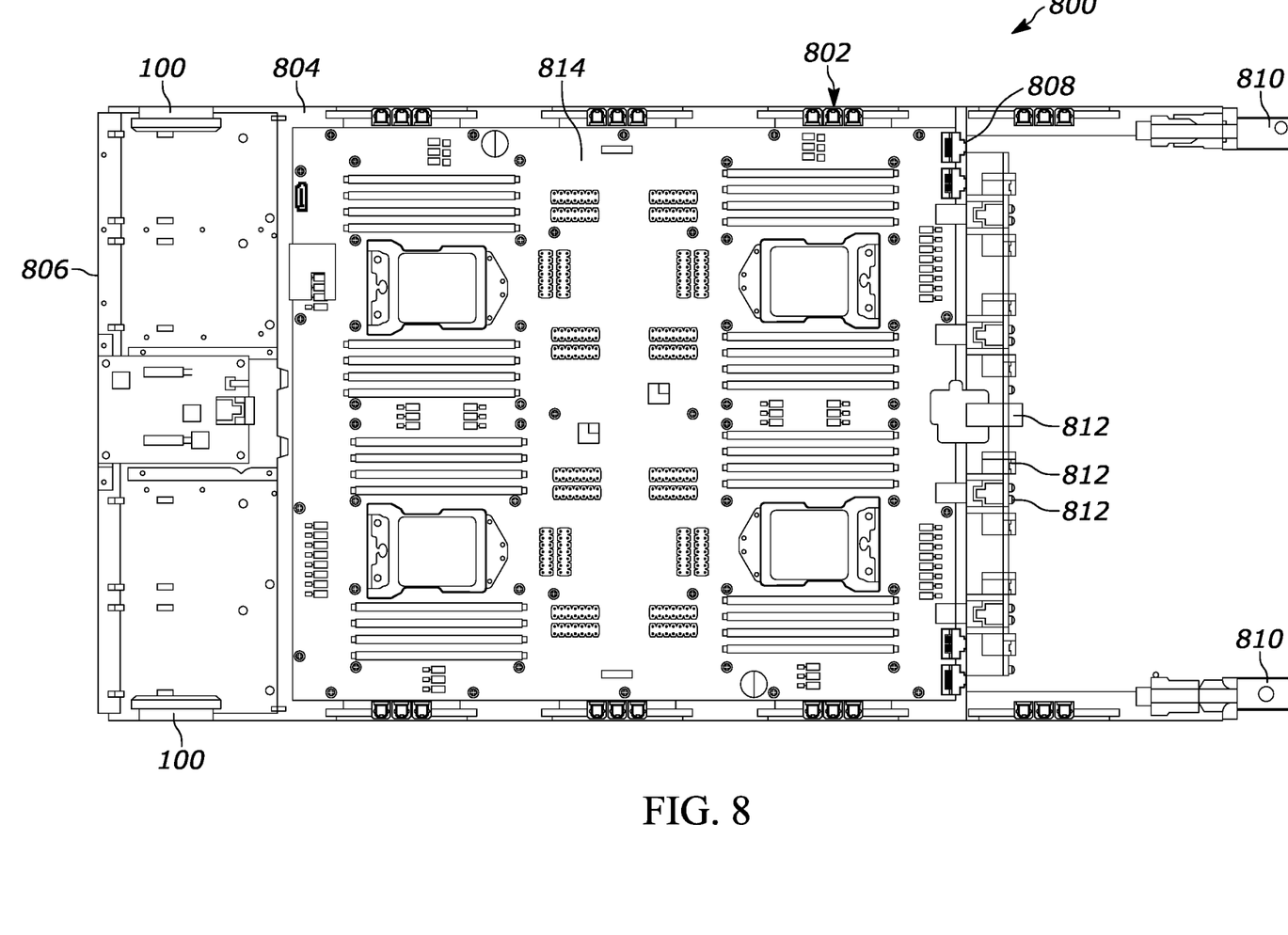
FIG. 8 depicts a overhead view of an electronic device that includes the latch assembly of FIG. 1, according to one or more examples of the present disclosure.

As previously mentioned, the latch assembly 100 may be coupled within an electronic device to facilitate mounting the electronic device within a computing system. FIG. 8 depicts a overhead view of an electronic device 800 that includes the latch assembly 100 of FIG. 1, according to one or more examples of the present disclosure. The electronic device 800 includes a modular device 802 having two latch assemblies 100 coupled thereto. The latch assemblies 100 may be secured to the modular device 802 using any suitable securing mechanism including, but not limited to one or more fasteners. The modular device 802 may be a pluggable compute module, switch module, or fiber module, for instance, which may be inserted into a computing system such as a server system.

The modular device 802 includes a housing 804, e.g., a tray, a circuit board 814 contained within the housing 804, and a plurality of connectors 810 and 812. The circuit board 814 has electronics (not shown) mounted thereon, and the connectors 810 and 812 terminate the electronics within the housing 804. The electronics of the circuit board 814 may communicatively couple to a computing system through the connectors 810 and 812, which are coupled to an end 808 of the modular device 802.

In an example, the connectors 810 are fluid couplers disposed on each side of the modular device 802. For instance, one connector 810 (e.g., the fluid coupler) includes a supply coolant manifold (not otherwise shown) that may receive coolant from a coolant system (not shown) to cool at least some of the electronics on the circuit board 814. The other connector 810 (e.g., the fluid coupler), accordingly, includes a return coolant manifold (not otherwise shown) that may return heated coolant back into the coolant system. The connectors 812 may include one or more types of electrical connectors such as power connectors, control management connectors, and/or high speed connectors.

The latch assemblies 100 may be coupled on each side of the housing 804 near an end 806 of the modular device 802. In an example, the fastener 104 (e.g., screws) of the latch assemblies 100 are accessible through openings (not shown) in the end 806 of the modular device 802. The openings may be through a faceplate of the modular device 802.

Figure 9:
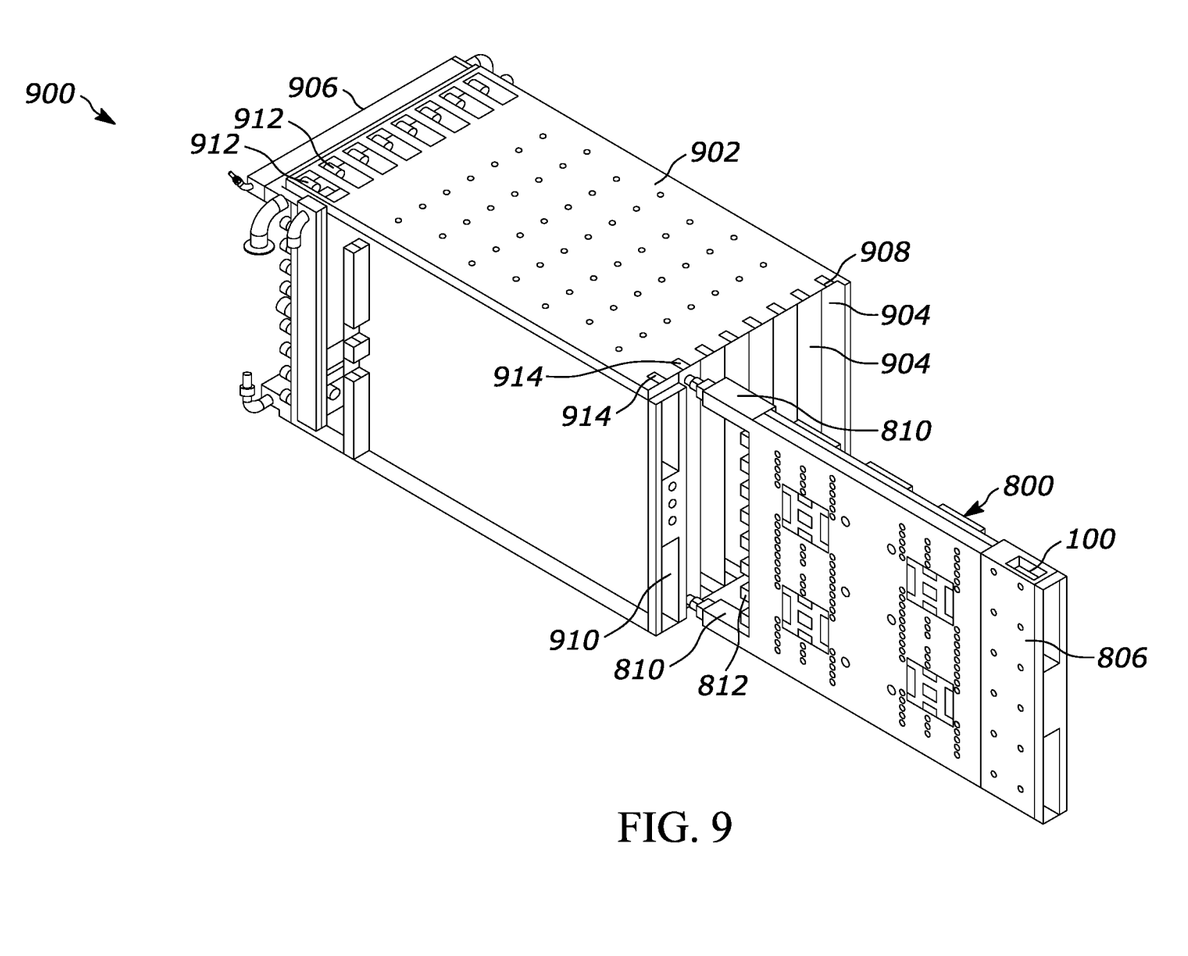
FIG. 9 depicts an isometric view of a computing system with multiple electronic devices that include the latch assembly of FIG. 1, according to one or more examples of the present disclosure.

FIG. 9 depicts an isometric view of a computing system 900 having multiple electronic devices that may include the latch assembly of FIG. 1, according to one or more examples of the present disclosure. The computing system 900 may form a part of or an entire server system, for example. The computing system 900 includes a chassis 902 having a first end 906 and a second end 908. The chassis 902 has multiple slots 904 formed therein and accessible through openings in the end 908 of the chassis 902. The slots 904 may each receive an electronic device of the computing system 900.

As further illustrated in FIG. 9, an electronic device 910 has been inserted into one of the slots 904. A second electronic device, in this example the electronic device 800 of FIG. 8, may be inserted into another of the slots 904. As illustrated in FIG. 8, the electronic device 800 includes two latch assemblies 100, which may be used to secure the electronic device 800 within the chassis 902. For example, the latch assemblies 100 may couple to protrusions 914 on each side of the chassis 902. The electronic device 910 may likewise include two latch assemblies 100, similarly located as shown in FIG. 8, which couple to the protrusions 914 to secure the electronic device 910 within the chassis 902.

Although not shown, the chassis 902 may contain a midplane having one or more electrical connectors that may mate with the connectors 812 of the electronic device 800 and connectors (not shown) of the electronic device 910. In the illustrated example, the chassis 902 includes connectors 912 coupled near the end 906 of the chassis 902. In a particular example, the connectors 912 are fluid couplers fluidly connected to a coolant system (not shown) of the computing system 900. The connectors 912 (e.g., fluid couplers) may mate with the connectors 810 (e.g., the fluid couplers) of the electronic device 800 and similar fluid couplers (not shown) of the electronic device 910. For example, the latch assemblies 100 may be operated to properly (e.g., without excessive force) blindmate the connectors of the chassis 902 with the connectors of the electronic devices 800 and 910 and secured the electronic devices 800 and 910 into the chassis 902.

In accordance with the present teachings, the latch assembly 100 may be designed or configured to control the amount of travel and force used to insert an electronic device into a chassis to avoid damaging the connectors of the electronic device and/or chassis. In an example, the latch assembly working distance range ($\Delta D$) and maximum travel ($D_1$) and a spring force ($F_D$) of the spring device 110 may be designed or configured to avoid damaging the connectors of the electronic device and/or chassis upon electronic device insertion. Reference to FIGS. 6-7 and 10-14 will be used to describe an example of configuring a latch assembly according to the present disclosure.

Figure 10:
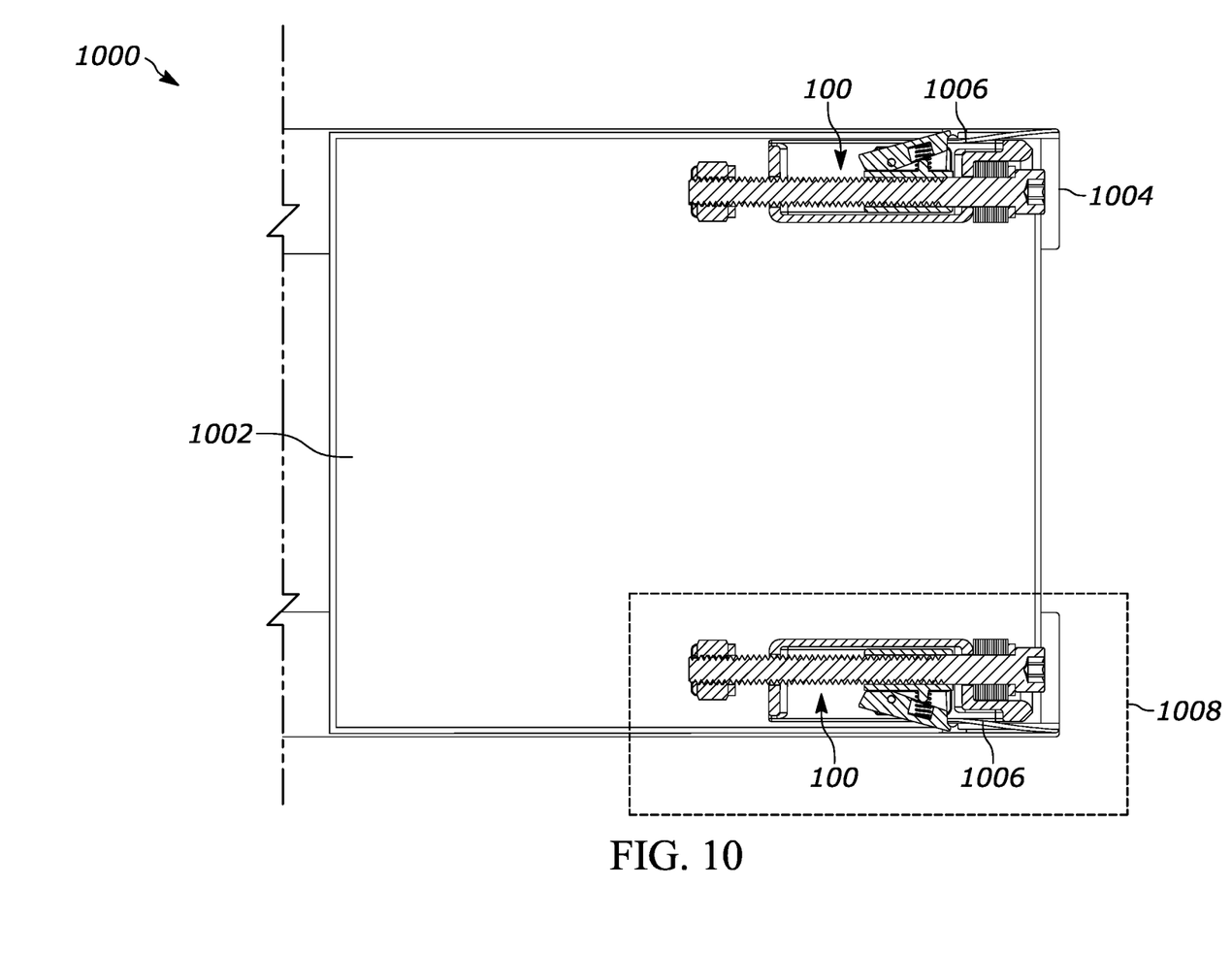
FIG. 10 depicts a simplified, partially cross-sectional view of a computing system that includes the latch assembly of FIG. 1, according to one or more examples of the present disclosure.

FIG. 10 depicts a simplified cross-sectional view of a computing system 1000 that includes the latch assembly 100 of FIG. 1, according to one or more examples of the present disclosure. In an example, the computing system 1000 is a simplified representation of a cross-section of the computing system 900 of FIG. 9. In this simplified view, the size of the latch assemblies 100 shown therein is exaggerated relative to the rest of the computing system 1000.

As illustrated, the computing system 1000 includes an electronic device 1002 inserted within a chassis 1004. The electronic device 1002 includes two latch assemblies 100 attached to sides of the electronic device 1002. The latch assemblies 100 engage with protrusions 1006 from respective sides of the chassis 1004 to secure the electronic device 1002 into the chassis 1004. The protrusions 1006 may be embossed edges of the chassis 1004.

FIGS. 11-14 depict enlarged views of a portion 1008 of the computing system 1000 cross-section shown in FIG. 10, with the latch assembly 100 in four different positional states, according to one or more examples of the present disclosure. The following description with respect to the latch assembly 100 included in the portion 1008 of the computing system applies equally to the other latch assembly of the computing system 1000.

Figure 11:
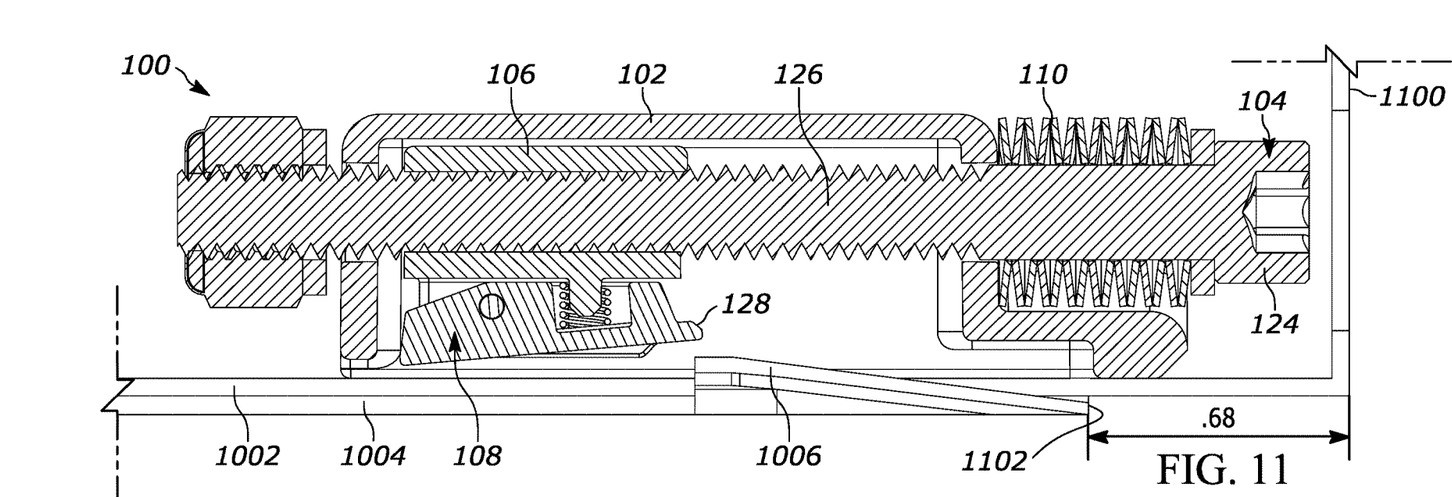
FIG. 11 depicts an enlarged view of a portion of the computing system cross-section shown in FIG. 10 with the latch assembly in the positional state shown in FIG. 5, according to one or more examples of the present disclosure.

FIG. 11 depicts the latch assembly 100 in the positional state shown in FIG. 5, wherein the latch pawl 108 is fully retracted within the latch body 102. As such, an edge 1100 of the electronic device 1002 extends 0.68" outside of or external to an end 1102 of the chassis 1004. In a particular example, this positional state may correspond to connectors of the electronic device 1002 initially engaging with connectors of the chassis 1004. Further, in this positional state, the fastener 104 may be rotated in a first direction, for instance using a screw driver inserted into the head 124, to further insert the electronic device 1002 into the chassis 1004.

Figure 12:
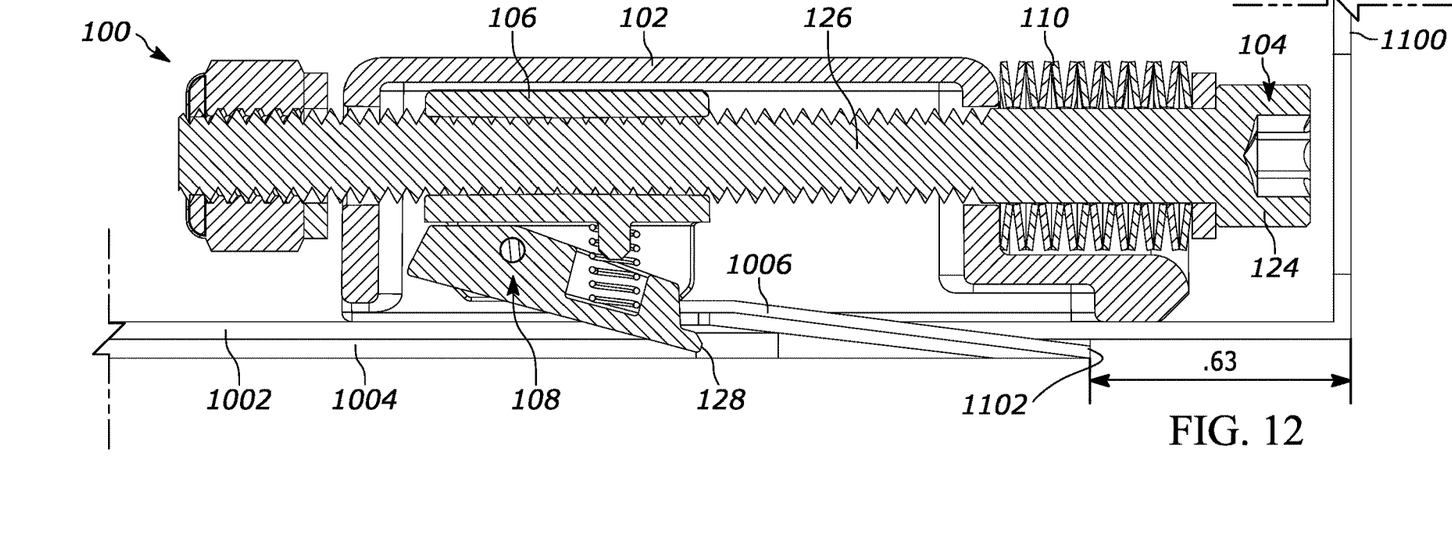
FIG. 12 depicts an enlarged view of a portion of the computing system cross-section shown in FIG. 10 with the latch assembly in another positional state, according to one or more examples of the present disclosure.

FIG. 12 depicts the latch assembly 100 in another positional state. For example, upon continued rotation of the fastener 104 in the first direction, the traveling body 106 linearly traverses the thread portion of the shank 126 of the fastener 104 until the latch pawl 108 fully extends from the latch body 108, and the extension member 128 of the latch pawl 108 engages with the protrusion 1006 (e.g., embossed edge) of the chassis 1004. In this positional state, the electronic device 1002 has traveled 0.05" into the chassis 1004. Accordingly, the edge 1100 of the electronic device 1002 extends 0.63" outside of or external to the end 1102 of the chassis 1004.

Figure 13:
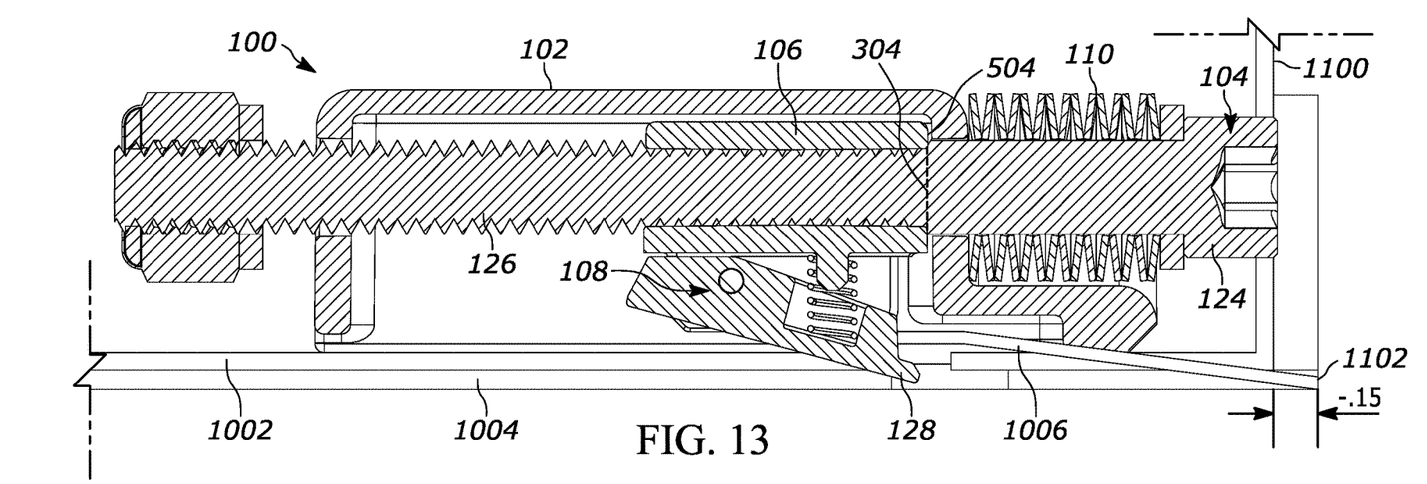
FIG. 13 depicts an enlarged view of a portion of the computing system cross-section shown in FIG. 10 with the latch assembly in the positional state shown in FIG. 6, according to one or more examples of the present disclosure.

FIG. 13 depicts the latch assembly 100 reaching the positional state shown in FIG. 6 upon continued rotation of the fastener 104 in the first direction. For example, this positional state may correspond to connectors of the electronic device 1002 being fully mated to connectors of the chassis 1004. Being "fully mated" means that the connectors are ready for communication, e.g., electrical and fluid, between the electronic device 1002 and the chassis 1004. In this positional state, no further rotation of the fastener 104 in the first direction is possible since the edge 504 of traveling body 106 has reached the thread run-out 304. Further in this positional state, the edge 1100 of the electronic device 1002 extends 0.15" inside of or internal to the end 1102 of the chassis 1004.

Figure 14:
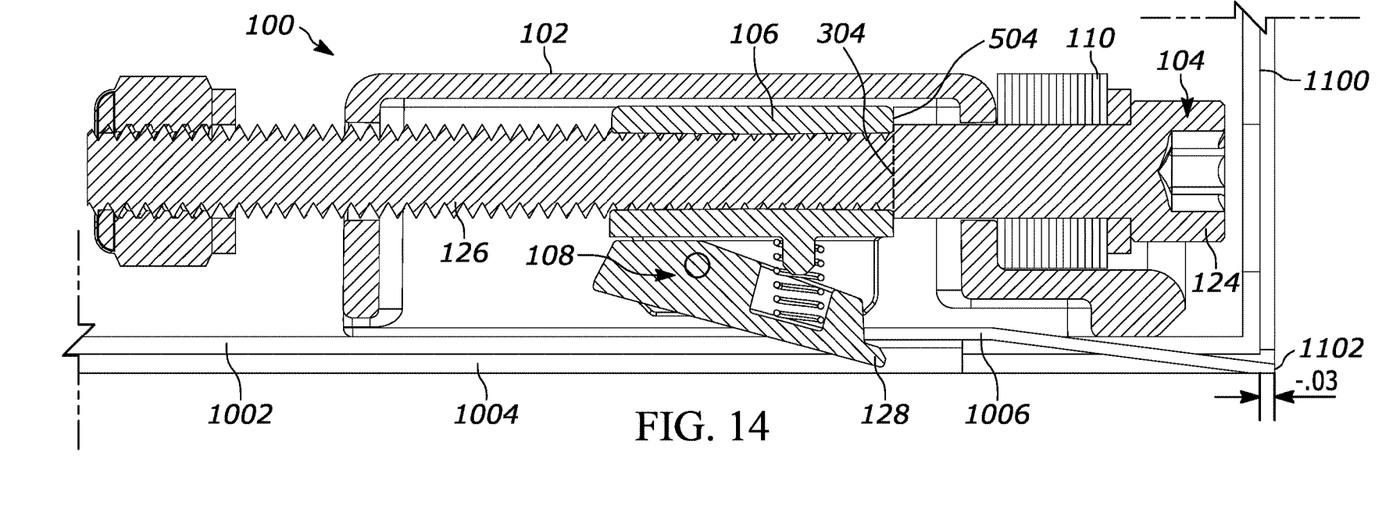
FIG. 14 depicts an enlarged view of a portion of the computing system cross-section shown in FIG. 10 with the latch assembly in the positional state shown in FIG. 7, according to one or more examples of the present disclosure.

FIG. 14 depicts the latch assembly 100 in the positional state shown in FIG. 7, wherein the spring device 110 is at maximum compression. As illustrated, in this positional state, the electronic device 1002 has moved back toward the end 1102 of the chassis 1004. As shown, in this positional state, the edge 1100 of the electronic device 1002 extends 0.03" inside of or internal to the end 1102 of the chassis 1004. An example benefit of the latch assembly 100 is that inclusion of the spring device 110 allows movement of an electronic device after mating of connectors of the electronic device with connectors of a chassis of a computing system. Such movement is beneficial when the computing system, e.g., the computing system 900, is operational or non-operation. Such movement may also account for positional tolerance of mated connectors by allowing the connectors to bottom out even though there may be significant positional tolerance between the modular device and the chassis connectors.

In one example, the computing system 900 may be operational, for instance in a data center. While operational, the computing system 900 may be connected to a coolant system that circulates coolant to cool various electronics of the computing system, such as electronics mounted to the circuit board 814 of the electronic device 800. In some scenarios, the coolant system may fail, for instance a failure in an expansion tank, and cause a pressure buildup in the fluid coupling between the electronic device 800 and the chassis 902. Instead of the pressure damaging the fluid coupling (or fluid piping and/or seals that may be included in the coolant system), the spring device 110 allows for movement of the electronic device 800 within the chassis 902 to relieve the pressure buildup.

In another example, the computing system 900 may be non-operational, for instance during shipment of the computing system 900. In a particular scenario, the computing system is shipped with the coolant inside the coolant system. Changes in ambient temperature may cause coolant expansion and, thereby, pressure buildup in the fluid coupling between the electronic device 800 and the chassis 902. Again, instead of the pressure damaging the fluid coupling, the spring device 110 allows for movement of the electronic device 800 within the chassis 902 to relieve the pressure buildup.

Another example benefit of the latch assembly according to the present teachings is ease of decoupling the electronic device from the computing system, e.g., from the chassis. For example, to decouple the electronic device from the chassis, the fastener is merely rotated until the cam of the latch pawl engages with the latch body, thereby retracting the latch pawl into the latch body. This creates clearance for removal of the electronic device from the chassis.

Adherence to some design parameters facilitates designing a latch assembly, e.g., the latch assembly 100, that allows full mating between the connectors of an electronic device and connectors of a computing system, e.g., connectors of a chassis of the computing system, without damage to the computing system. In a particular example, a computer-aided design ("CAD") system may be used to design the latch assembly 100.

For one parameter, the latch assembly working distance range ($\Delta D$) is greater than or equal to $\tilde{O}$, which is a positional tolerance that ensures that the connectors of the electronic device fully mate with the connectors of the chassis. In the example illustrated by reference to FIGS. 13-14, $\tilde{O}=-0.3"-(-0.15")=0.12"$. In the example illustrated by reference to FIGS. 6-7, $\Delta D=1.614"-1.494"=0.12"$, which is equal to $\tilde{O}$.

For another parameter, the latch assembly maximum travel distance ($D_1$) is greater than connector engagement coupling distances. In the example illustrated by reference to FIGS. 11 and 13, the connector engagement coupling distance is $0.68"-(-0.15")=0.83"$. In the example illustrated by reference to FIGS. 5-6, $D_1=1.614"$ which is greater than 0.83".

For another parameter, a force at $D_1=F_{D1}$ is greater than or equal to $F_{min}=(F_1+F^2+F_3 \ldots +F_n)/2$. In this equation, $F_{min}$ represents a minimum insertion force needed to ensure the connectors of the electronic device fully mate with the connectors of the chassis. Moreover, $F_n$ represents a force of a given connector coupling. All forces are added together for all connector couplings between the electronic device and the chassis, which may also include friction and electromagnetic interference ("EMI") gasket forces. For an additional parameter, a maximum spring device force or a force at $D_2=F_{D2}$ is greater than $F_{max}$. $F_{max}$ represents a maximum allowable insertion force to avoid crushing or damaging connectors or other mechanical parts of the electronic device and/or chassis. In the example illustrated by reference to FIGS. 10-14, let $F_{min}=40$ lbf and $F_{max}=75$ lbf. For yet another parameter, a difference (also referred to herein as an allowance) between a deflection of the spring device at $D_1$ and a deflection of the spring device at $D_2$ is greater than or equal to $\tilde{O}$. Moreover, the allowance also provides for sufficient movement of the electronic device within the chassis. Sufficient movement may depend, at least in part, on expected maximum force or pressure due to expansion of coolant while the computing device is operation and non-operational.

The allowance, $F_{min}$ and $F_{max}$ of the spring device 110 may be designed based on the characteristics of the disc springs or coils used to construct the spring device 110. In an example where Belleville washers are used to construct the spring device 110, the following table may be used to design the allowance, $F_{min}$, and $F_{max}$ of the spring device 110 to satisfy the parameters described above. Each row of the table represents a set of characteristics for a particular Belleview washer.

| Thickness | Height | Deflection @ Working load | Working Load, lbs | Flat Load, lbs |
|---|---|---|---|---|
| 0.018" | 0.034" | 0.008" | 45 | 70 |
| 0.022" | 0.036" | 0.007" | 65 | 115 |
| 0.025" | 0.038" | 0.007" | 96 | 160 |

For the example where $F_{min}=40$ lbf and $F_{max}=75$ lbf, a spring device 110 may be designed having 15 Belleview washers from the first row of the above table arranged in the inverted stack configuration. Such a design has a working load of 45 lbf and a flat (or maximum) load of 70 lbs, which is respectively greater than $F_{min}$ and less than $F_{max}$ for the connector couplings between the electronic device 800 and the chassis 902. The design further produces a deflection at the working load (which is the deflection at $D_1$) of 0.120" and a deflection at the flat load (which is the deflection at $D_2$) of 0.232". Accordingly, this design produces an allowance of 0.112", which is greater than or equal to $\tilde{O}=0.100"$ for the connector couplings between the electronic device 800 and the chassis 902.

Figure 15:
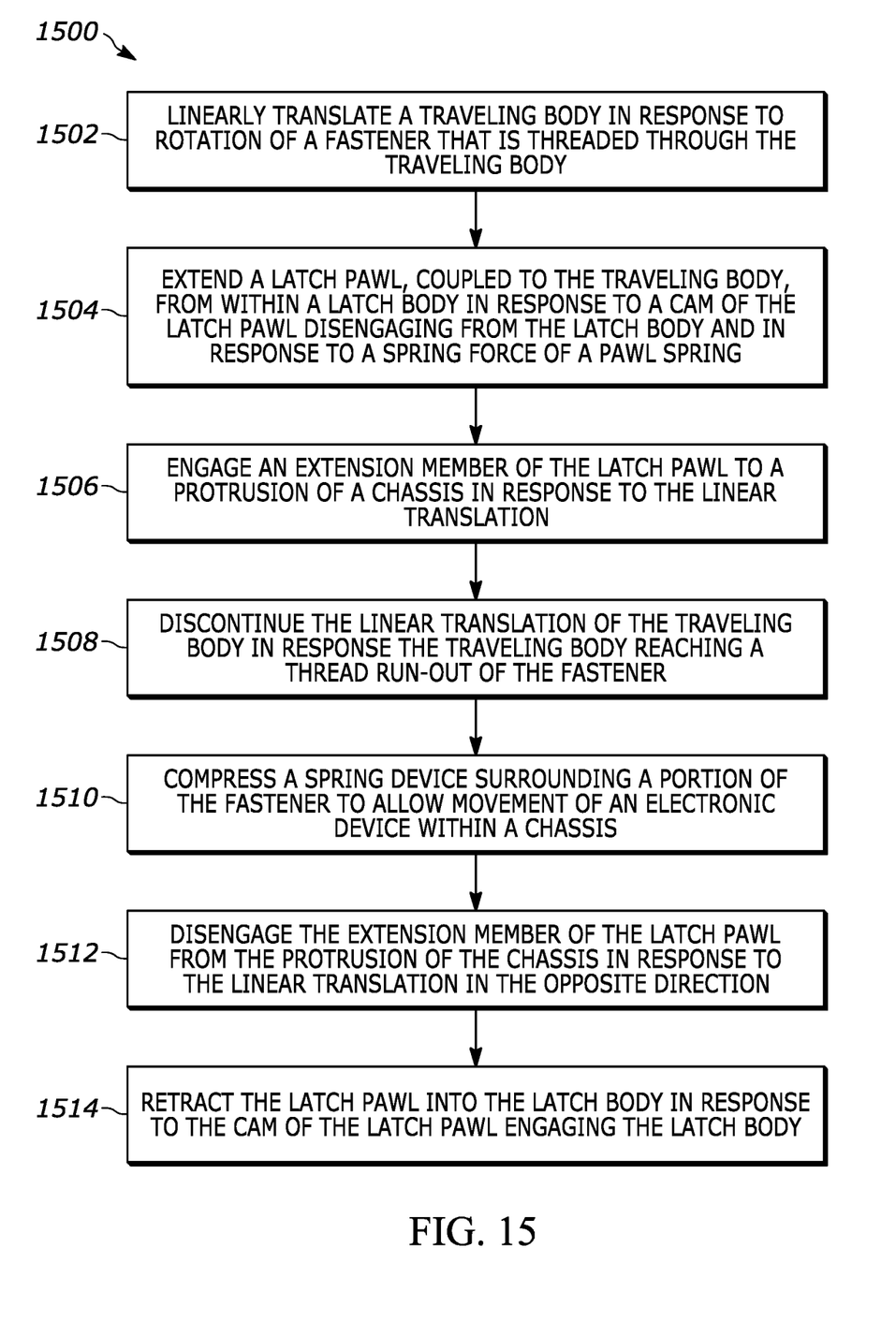
FIG. 15 depicts a flow diagram illustrating a method for operating a latch assembly, according to one or more examples of the present disclosure.

FIG. 15 depicts a flow diagram illustrating a method 1500 for operating a latch assembly, according to one or more examples of the present disclosure. Method 1500 will be described by reference to operation of the latch assembly 100 shown in FIGS. 1-2, 5-7, and 11-14. Where an electronic device, such as the electronic device 1002, contains multiple latch assemblies 100, the method 1500 may be performed for each latch assembly 100.

At a block 1502, the traveling body 106 is linearly translated in response to rotation of the fastener 104 that is threaded through the traveling body 106. As the fastener 104 continues to be rotated, the latch pawl 108 is extended (1504) from within the latch body 102 in response to the cam 500 of the latch pawl 108 disengaging from the latch body 102 and in response to a spring force of the pawl spring 116, as shown in FIG. 12. Upon further linear translation of the traveling body 106, the extension member 128 of the latch pawl 108 engages (1506) with the protrusion 1006 of the chassis 1004, also shown in FIG. 12. Linear translation (and rotation of the fastener 104) is discontinued (1508) upon the traveling body 106 reaching the thread run-out 304 of the fastener 104, as shown in FIG. 13. While in the positional state shown in FIG. 13, the spring device 110 may be further compressed (1510), for instance as shown in FIG. 14, to allow movement of the electronic device 1002 within the chassis 1004.

In order to remove the electronic device 1002 from the chassis 1004, for instance, the traveling body 106 is linearly translated (1512) in an opposite direction in response to rotation of the fastener 104 in an opposite rotational direction. Upon further linear translation of the traveling body 106 in the opposite direction, the extension member 128 of the latch pawl 108 disengages (1514) from the protrusion 1006 of the chassis 1004. When the cam 500 of the latch pawl 108 engages with the latch body 102, the cam 500 causes the latch pawl 108 to pivot into the latch body 102. When the latch pawls 108 are retracted, the electronic device 1002 may be removed from the chassis 1004.

Further, as used herein, the article "a" is intended to have its ordinary meaning in the patent arts, namely "one or more." Herein, the term "about" when applied to a value generally means within the tolerance range of the equipment used to produce the value, or in some examples, means plus or minus 10%, or plus or minus 5%, or plus or minus 1%, unless otherwise expressly specified. Further, herein the term "substantially" as used herein means a majority, or almost all, or all, or an amount with a range of about 51% to about 100%, for example. Moreover, examples herein are intended to be illustrative only and are presented for discussion purposes and not by way of limitation.

The foregoing description, for purposes of explanation, used specific nomenclature to provide a thorough understanding of the disclosure. However, it will be apparent to one skilled in the art that the specific details are not required in order to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described in order to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

What is claimed is:

1. A latch assembly, comprising:
    a latch body;
    a fastener longitudinally inserted through the latch body, the fastener comprising:
        a head;
        a shank including a thread portion and a second portion, with the second portion disposed between the thread portion and the head;
    a traveling body threaded onto the thread portion of the shank such that the traveling body longitudinally traverses the thread portion as the fastener is rotated;
    a latch pawl pivotally coupled to the traveling body and pivoting while engaging and disengaging the latch body; and
    a spring device disposed on the shank between the head and the latch body, the spring device surrounding the second portion of the shank.

2. The latch assembly of claim 1, wherein the spring device comprises a plurality of disc springs.

3. The latch assembly of claim 1, wherein the spring device has a spring force designed to at least partially control an amount of force applied to one or more connectors of a modular device when inserting the modular device into a computing system.

4. The latch assembly of claim 3, wherein the spring device has a maximum spring force that is less than a maximum allowable insertion force when inserting the modular device into the computing system.

5. The latch assembly of claim 3, wherein the spring device has a minimum spring force that is greater than or equal to a minimum insertion force to mate the modular device with the computing system.

6. The latch assembly of claim 1, wherein the latch assembly allows movement of the spring device when the traveling body is located at an end of the thread portion and the latch pawl is disengaged from the latch body.

7. The latch assembly of claim 1, wherein the fastener is one of:
    a partially threaded screw; or
    a shoulder screw.

8. The latch assembly of claim 1, further comprising a pawl spring coupled between the latch pawl and the traveling body, and wherein the latch pawl comprises a cam formed on one end of the latch pawl.

9. The latch assembly of claim 8, wherein:
    the latch pawl compresses the pawl spring to retract the latch pawl into the latch body when the cam engages the latch body; and
    a spring force of the pawl spring extends the latch pawl from within the latch body when the cam disengages the latch body.

10. The latch assembly of claim 1, wherein a working distance range of the latch assembly is greater than or equal to a positional tolerance to mate the modular device with a computing system.

11. An electronic device, comprising:
    a modular device, comprising:
        a housing;
        electronics within the housing; and
        a set of connectors coupled to the housing and that terminate the electronics within the housing; and
    a latch device, comprising:
        a latch body;
        a fastener longitudinally inserted through the latch body, the fastener comprising:
            a head;
            a shank including a thread portion and a second portion, with the second portion disposed between the thread portion and the head;
        a traveling body threaded onto the thread portion of the shank such that the traveling body longitudinally traverses the thread portion as the fastener is rotated;

a latch pawl comprising:
  a cam formed on one end of the latch pawl; and
  an extension member formed on an opposite end of the latch pawl;
a pawl spring coupled between the latch pawl and the traveling body, wherein the pawl spring allows the latch pawl to pivot as the cam engages and disengages the latch body; and
a spring device disposed on the shank between the head and the latch body, the spring device surrounding the second portion of the shank.

12. The electronic device of claim 11, wherein the spring device comprises a plurality of disc springs.

13. The electronic device of claim 11, wherein the spring device has a maximum spring force that is less than a maximum allowable insertion force when inserting the modular device into a chassis.

14. The electronic device of claim 11, wherein the spring device has a minimum spring force that is greater than or equal to a minimum insertion force to mate the set of connectors of the modular device with a corresponding set of connectors of a chassis.

15. The electronic device of claim 11, wherein the latch assembly allows movement of the spring device when the traveling body is located at an end of the thread portion and the latch pawl is disengaged from the latch body.

16. The electronic device of claim 11, wherein:
the latch pawl compresses the pawl spring to pivot the latch pawl into the latch body when the cam engages the latch body; and
a spring force of the pawl spring pivots the latch pawl from within the latch body when the cam disengages the latch body.

17. A method for operating a latch assembly, the method comprising:
linearly translating a traveling body in response to rotation of a fastener that is threaded through the traveling body;
extending a latch pawl, coupled to the traveling body, from within a latch body in response to a cam of the latch pawl disengaging from the latch body and in response to a spring force of a pawl spring; and
discontinuing the linear translation of the traveling body in response the traveling body reaching a thread run-out of the fastener.

18. The method of claim 17, further comprising engaging an extension member of the latch pawl to a protrusion of a chassis in response to the linear translation.

19. The method of claim 17, further comprising:
linearly translating the traveling body in an opposite direction in response to rotation of the fastener in an opposite rotational direction;
disengaging the extension member of the latch pawl from the protrusion of the chassis in response to the linear translation in the opposite direction; and
retracting the latch pawl into the latch body in response to the cam of the latch pawl engaging the latch body.

20. The method of claim 17, further comprising compressing a spring device surrounding a portion of the fastener to allow movement of an electronic device with a chassis.

* * * * *